United States Patent [19]
Kirkland et al.

[11] Patent Number: 5,885,848
[45] Date of Patent: Mar. 23, 1999

[54] BALL GRID ARRAY WITH INEXPENSIVE THREADED SECURE LOCKING MECHANISM TO ALLOW REMOVAL OF A THREADED HEAT SINK THEREFROM

[75] Inventors: Janet Kirkland, Fremont; Mark R. Schneider, San Jose, both of Calif.

[73] Assignee: LSI Logic Corporation, Milpitas, Calif.

[21] Appl. No.: 901,489

[22] Filed: Jul. 28, 1997

Related U.S. Application Data

[62] Division of Ser. No. 724,076, Sep. 30, 1996, Pat. No. 5,789,813.

[51] Int. Cl.$^6$ .......................... H01L 21/44; H01L 21/48; H01L 21/50
[52] U.S. Cl. .......................... 438/106; 438/106; 438/118; 438/126
[58] Field of Search .................................. 438/106, 118, 438/126

[56] References Cited

U.S. PATENT DOCUMENTS

| | | |
|---|---|---|
| 4,612,978 | 9/1986 | Cutchaw . |
| 4,748,495 | 5/1988 | Kucharek . |
| 4,884,169 | 11/1989 | Cutchaw . |
| 5,227,663 | 7/1993 | Patil et al. . |
| 5,285,352 | 2/1994 | Pastore et al. . |
| 5,293,930 | 3/1994 | Pitasi . |
| 5,311,060 | 5/1994 | Rostoker et al. . |
| 5,355,283 | 10/1994 | Marrs et al. . |
| 5,386,342 | 1/1995 | Rostoker . |
| 5,397,919 | 3/1995 | Tata et al. . |
| 5,451,274 | 9/1995 | Gupta ........................................ 438/615 |
| 5,467,253 | 11/1995 | Heckman et al. . |
| 5,525,835 | 6/1996 | Nishiguchi . |
| 5,528,159 | 6/1996 | Charlton et al. . |
| 5,555,488 | 9/1996 | McLellan et al. ....................... 438/124 |
| 5,610,442 | 3/1997 | Schneider et al. . |
| 5,619,070 | 4/1997 | Kozono . |
| 5,620,928 | 4/1997 | Lee et al. ................................. 438/124 |
| 5,672,547 | 9/1997 | Jeng et al. ............................... 438/118 |

FOREIGN PATENT DOCUMENTS 4-72747  3/1992  Japan .

*Primary Examiner*—Kevin M. Picardat
*Assistant Examiner*—Deven Collins

[57] ABSTRACT

An integrated circuit package having a die supported on a ball grid array substrate and wire bonds electrically connecting the die to the substrate. Supported on the substrate is a lock ring having a threaded opening encircling the die. Encapsulant covers the die and the wire bonds and adheres the lock ring to the substrate. A heat sink having a threaded portion can be threaded into the lock ring into an operative cooling position relative to the die and subsequently to an unthreaded removed position. When in the latter position, a repair station can be positioned over the package and the solder balls are accessible for hot gas melting thereof for removal (or replacement) of the package from the underlying motherboard.

20 Claims, 3 Drawing Sheets

BALL GRID ARRAY WITH INEXPENSIVE THREADED SECURE LOCKING MECHANISM TO ALLOW REMOVAL OF A THREADED HEAT SINK THEREFROM

CROSS-REFERENCE TO RELATED APPLICATION

This is a divisional of application Ser. No. 08/724,076, filed Sep. 30, 1996 now U.S. Pat. No. 5,789,815.

BACKGROUND OF THE INVENTION

The present invention is directed to constructions of ball grid array (BGA) packages having heat sinks and to methods for removing those packages from printed circuit boards or motherboards for repair or replacement.

A BGA is a packaged integrated circuit in which one or more integrated circuit chips (semiconductor dies on which electrically conductive circuitry are formed) are mounted on a (top) surface of a substrate, and an electrical connection to electrically conductive material not part of the packaged integrated circuit, such as a printed circuit board, is made by an array of solder balls located on a (bottom) surface of the substrate opposite the surface to which the integrated circuit chip or chips are attached. Passive components such as resistors or capacitors can also be mounted on the top surface of the substrate. The substrate can be a multi-layer substrate, electrically conductive traces and/or regions being formed on a surface of each layer of the substrate. The integrated circuit chip or chips and the passive components are typically encapsulated by, for instance, plastic to protect them from the external environment. The integrated circuit chip or chips are electrically connected to the substrate by wire bonding or by tape-automated bonding (TAB), or flip-chip interconnection. BGAs allow a higher density of external chip connections to be made than do other packaged integrated circuits having leads extending from the package. An example of a BGA package is shown in U.S. Pat. No. 5,355,283 (Marrs, et al.).

Heat is inevitably generated during the operation of integrated circuit devices, such as BGAs. In some instances, the amount of heat generated can be sufficient to irreparably damage or even destroy the device. Continuing advances in the number of transistors and other functional elements contained in a single integrated circuit, and the increasingly high speeds at which integrated circuits now operate, both contribute to the problem of integrated circuit heat dissipation. The heat can be so great that some devices require that a powered fan be incorporated on them to prevent their failure; an example is the Pentium chip available from Intel Corp. and which is sometimes sold with a small fan mounted on the component itself.

It is generally well known to provide some sort of heat sink for semiconductor devices to remove and dissipate the heat. A variety of methods and devices have been developed for removing at least some of the heat from integrated circuit devices. Typically a unitary heat sink structure has been used. Heat sinks generally include at least a heat-transferring portion proximate to the semiconductor device for extracting heat therefrom, and a heat-dissipating portion remote from the die with a large surface area for dissipating heat. The heat-dissipating portion is typically formed with a number of parallel layers, through which air passes to remove heat from the heat sink. Typically, the entire heat sink structure may simply be disposed on an exterior of a package, such as on the lid of a lidded package.

The heat sinks are typically attached to the package with epoxy. However, this renders them vulnerable to being impacted and torn away. Also, they cannot be easily removed from the package. Additionally, when attached, repair stations cannot be fitted over them to allow hot nitrogen gas to reflow the solder balls. This prevents defective packages from being removed from motherboards for repair or replacement.

Other types of heat sink securements are known, as shown in U.S. Pat. Nos. 5,227,663 (Patil, et al.) and 5,293,930 (Pitasi). A further example is a threaded heat sink attachment available from Vemaline Products of Warwick, Rhode Island. This attachment provides that the heat sink is threaded into a small clip-on device. This device is made of plastic and is clipped over the sides of the printed circuit board. However, this device does not work well, since it falls off easily.

SUMMARY OF THE INVENTION

Directed to remedying the problems in the prior art, disclosed herein is an improved BGA package having a die mounted on and wire-bonded to a substrate. The package has a threaded lock ring encircling the die. Encapsulant protectively covering the die and the wire bonds also secures the lock ring directly to the substrate. The lock ring, for example, can be an inexpensive commercially-available electric box lock nut. When the nut is secured to the substrate, the threaded female opening encircles the die (and wire bonds). A heat sink having a threaded male portion can be screwed into the female opening and into an operative position for cooling the die.

The package is secured via the BGA under the substrate to a printed circuit board or motherboard. When the package is damaged or otherwise is needed to be removed from the motherboard, removal (unlike the prior art packages) is easy pursuant to this invention. The heat sink is simply unthreaded from the lock ring and removed. The underlying package is thereby accessible so that a repair station can be effectively positioned thereover and hot gases efficiently directed to the solder balls. The solder balls are melted or reflowed and the package removed off of the board.

Other objects and advantages of the present invention will become more apparent to those persons having ordinary skill in the art to which the present invention pertains from the foregoing description taken in conjunction with the accompanying drawings.

DETAILED DESCRIPTION OF PREFERRED EMBODIMENTS OF INVENTION

Figure 1:
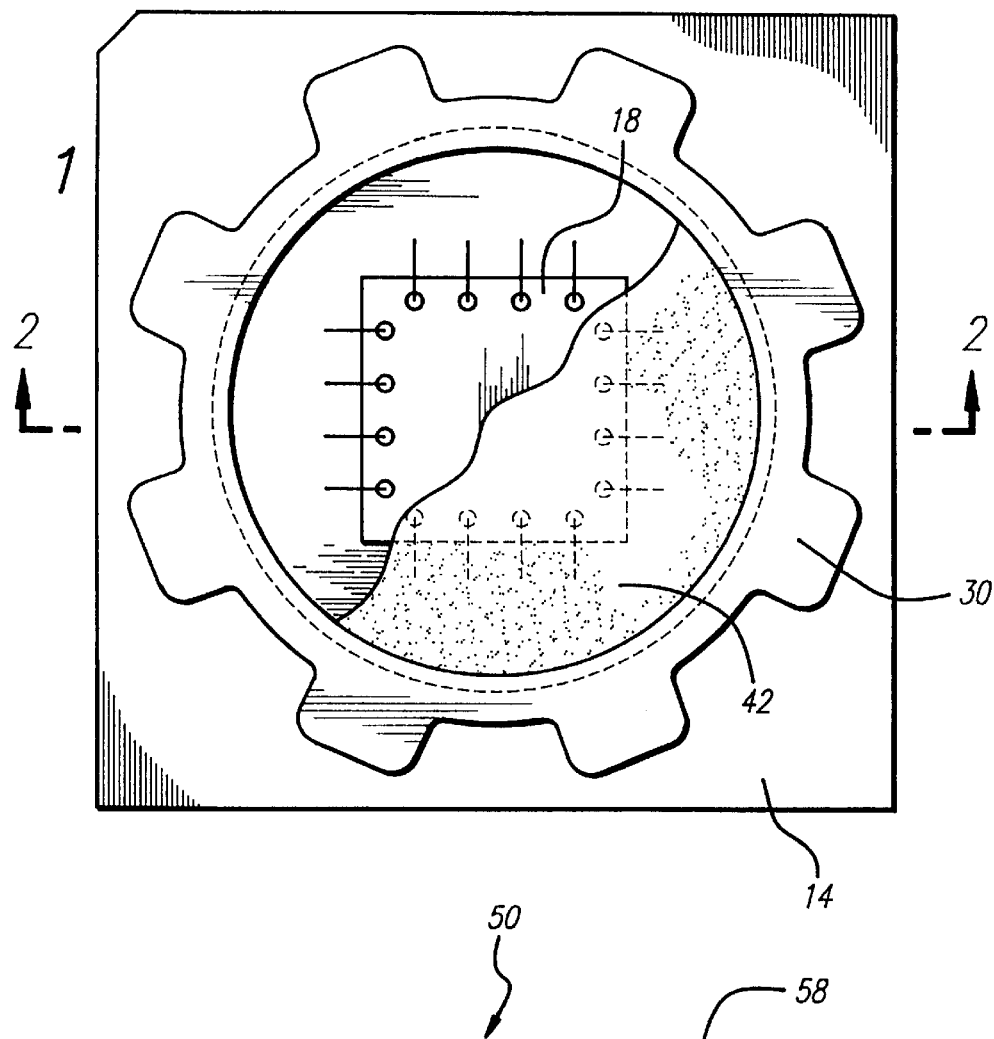
FIG. 1 is a top plan view of a BGA package of the present invention without a heat sink and with portions thereof broken away for illustrative purposes.

Referring to the drawings, an integrated circuit package of the present invention is illustrated generally at 10. Package 10 includes a BGA substrate 14. An integrated circuit die or chip 18 is mounted on the substrate 14 and electrically connected thereto by wire bonds 26. A lock ring 30 is attached to the top of the substrate 14 with Loctite or other adhesive 34. It is attached with the threaded opening 38 thereof surrounding the die 18. The threaded opening 38 is preferably a one-inch pipe thread. Hysol encapsulant 42 is poured into the opening to cover the die 18 and wire bonds 26. The encapsulant 42 when cured thereby also secures the lock ring 30 to the substrate 14.

The lock ring 30 can be an electrical box lock nut cast of white metal. They are commercially available retail and are very inexpensive, perhaps ten cents apiece. In large wholesale volumes, the lock nuts would likely cost no more than five cents each.

Thus, steps of a preferred method of constructing the package 10 are as follows:

(1) a die 18 is attached to a BGA substrate 14 or more particularly an EPBGA substrate;

(2) the die is electrically connected to the substrate with wire bonds 26;

(3) a threaded lock ring 30 is positioned on the substrate 14 using a light application of Loctite adhesive 34 to the substrate; and (4) the threaded opening 38 is filled with HYSOL encapsulant to completely cover the wire bonds and the die.

Figure 2:
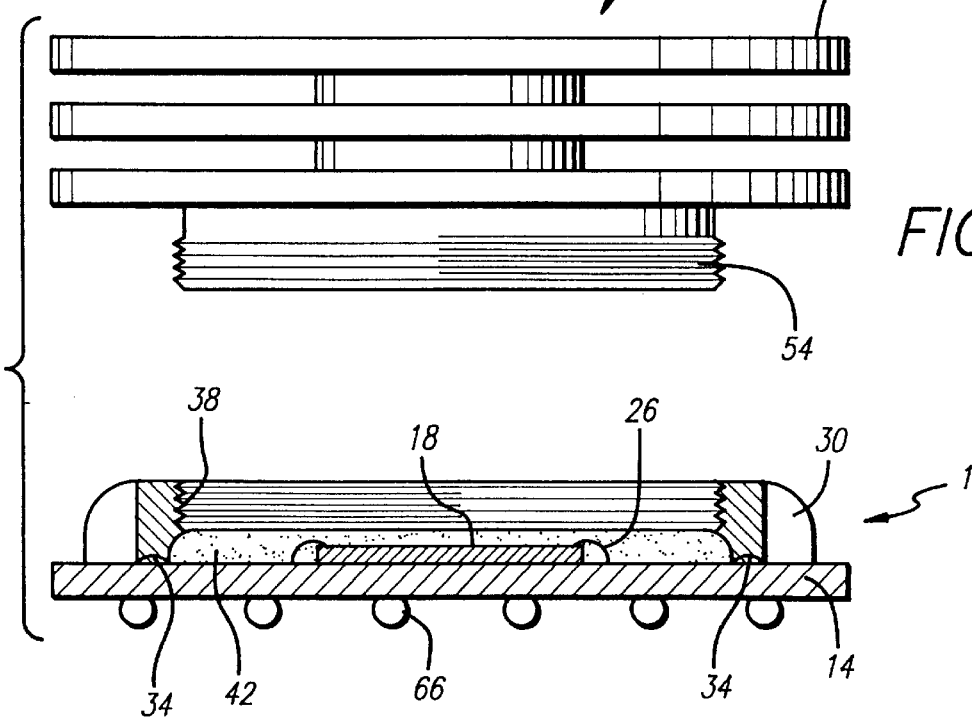
FIG. 2 is a cross-sectional view of the package of FIG. 1 taken on line 2—2 and illustrated with a heat sink.
Figure 3:
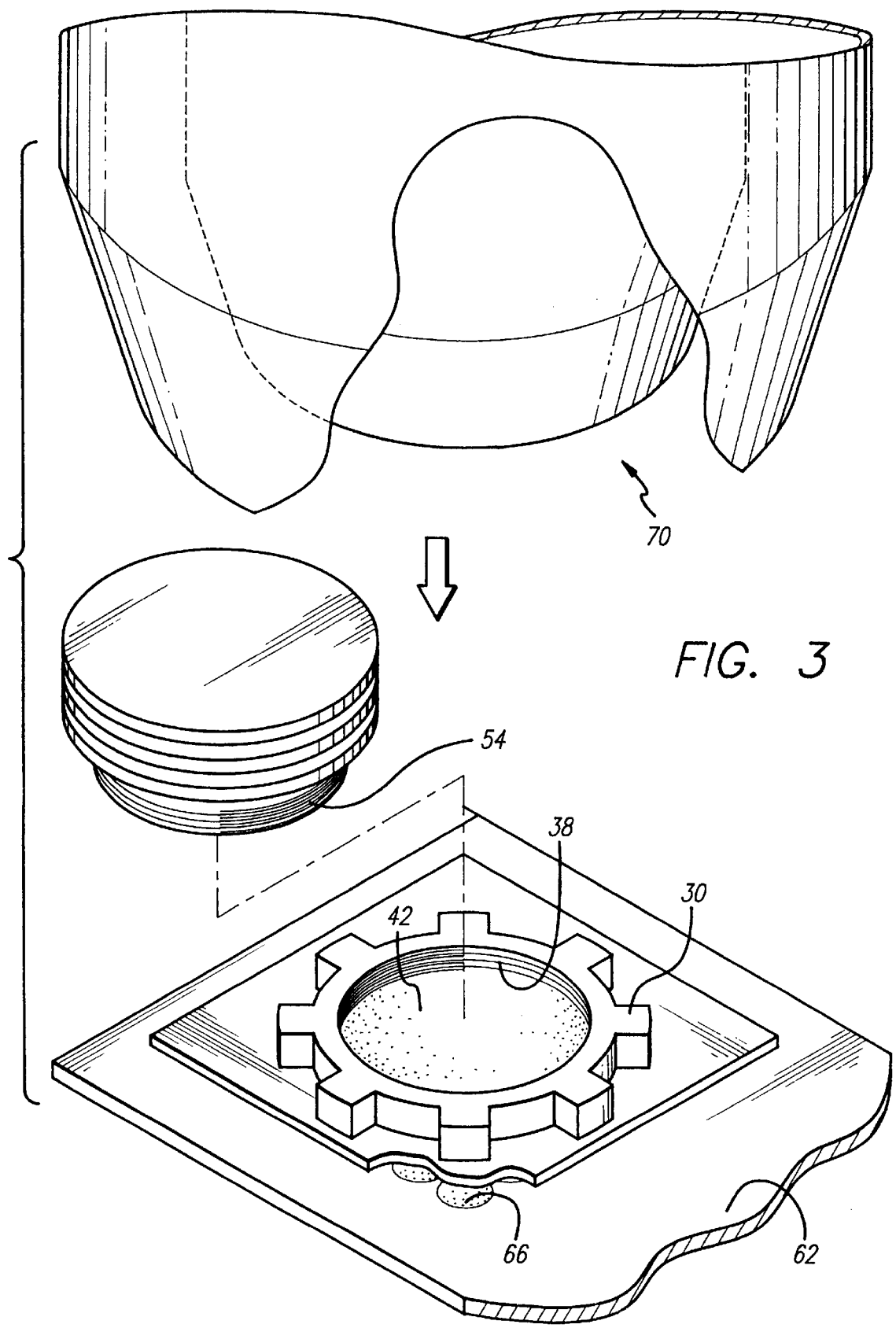
FIG. 3 is a fragmentary perspective view of the package of FIG. 1 mounted on an underlying motherboard with the heat sink shown unthreaded and removed therefrom and a repair station being positioned thereover, the repair station having portions thereof broken away for illustrative purposes.

After the encapsulant 42 has cured, a threaded heat sink 50, as shown in FIGS. 2 and 3, can be screwed into the threaded opening 38. The heat sink 50 has a male threaded portion 54 and horizontal fins 58 secured thereon. An example of a preferred threaded heat sink 50 is that available from Vemaline Products.

The package 10 is attached to a printed circuit board or motherboard 62 by reflowing the solder balls 66 of the BGA substrate 14. The securement of the package 10 to the motherboard 62 is shown in FIG. 3. The heat sink 50 can be threaded into a secure position in the threaded opening 38 before or preferably after the package 10 is secured to the motherboard 62, as shown in FIG. 3.

Figure 4:
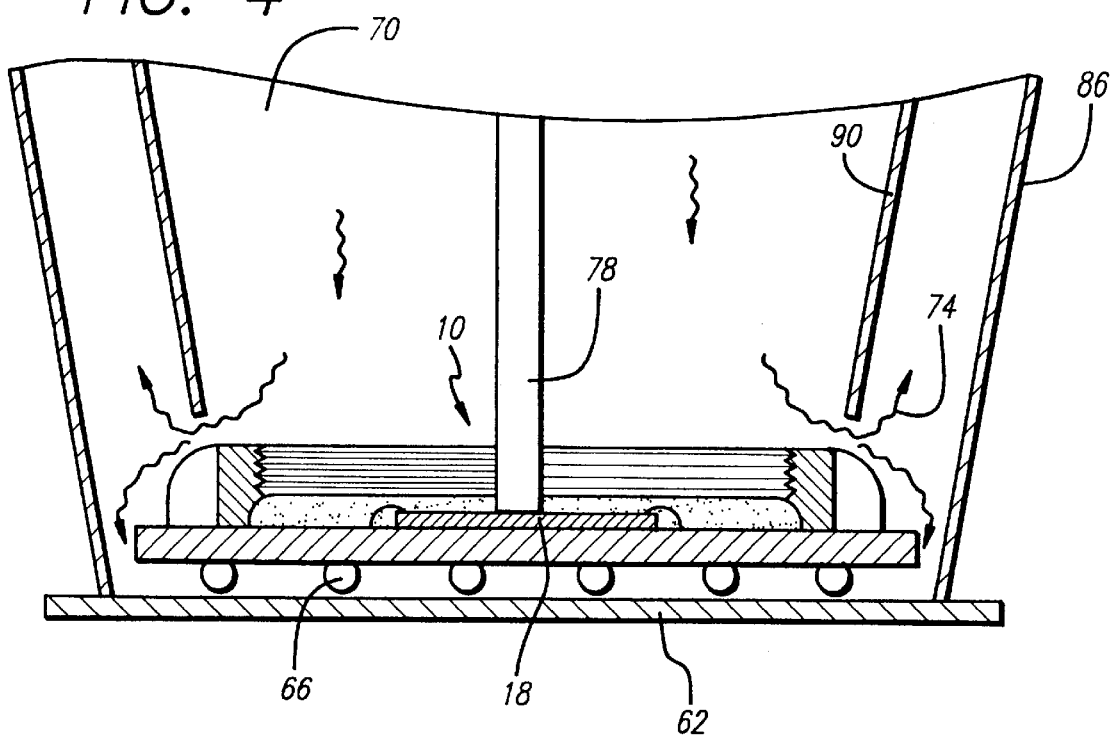
FIG. 4 is a cross-sectional view showing the package with the repair station of FIG. 3 positioned thereover in a die removal process.
Figure 5:
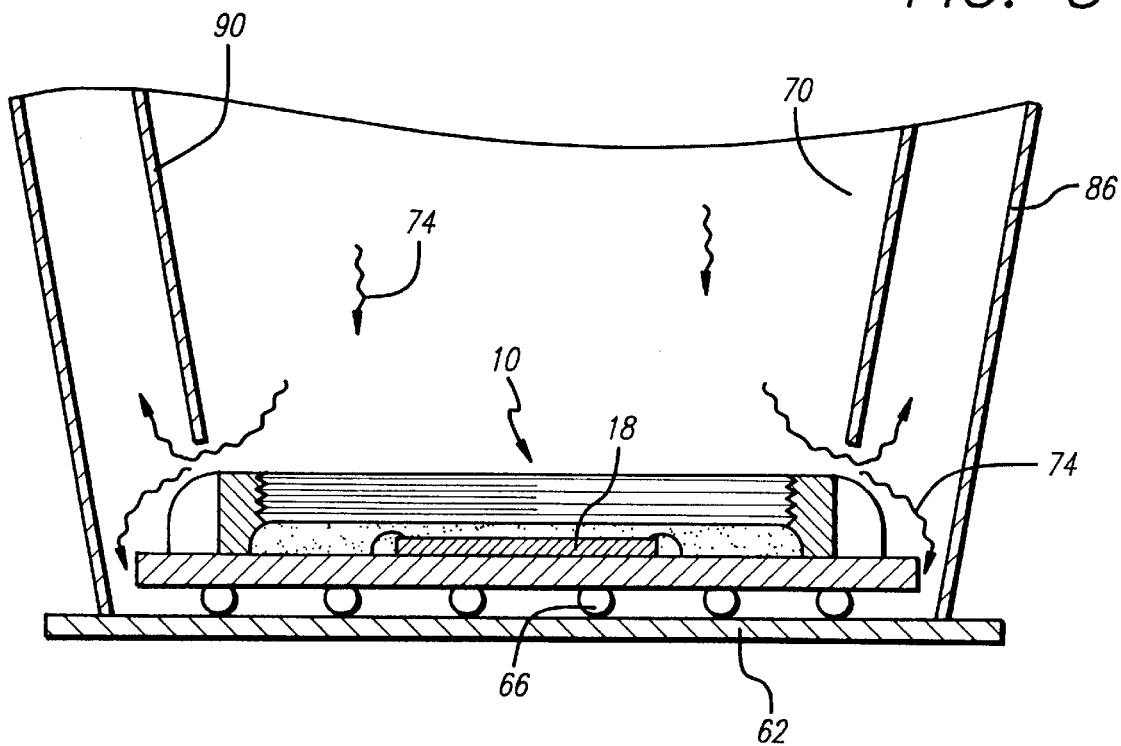
FIG. 5 is a view similar to FIG. 4 showing a die replacement process of the invention.

Should the package 10, or more particularly the die 18, be or become defective, the present invention allows for easy removal from the motherboard 62 for replacement or removal (for repair), as can be understood from FIGS. 3–5. First the heat sink 50 is unthreaded from the threaded opening 38 and removed from the package 10. The repair station 70 is then positioned securely over the package 10, and hot nitrogen gas 74 is pumped in and directed to the solder balls 66. With the solder balls 66 melted or reflowed, the package 10 can be removed from the motherboard 62. The heat sink 50 can be threaded on and off as many times as needed.

FIG. 4 shows the repair station 70 in position in a component (package 10 or die 18) removal process. Since the heat sink 50 has been removed, the vacuum tube 78 can efficiently access the component. Thereby a suction removal pressure applied thereto by the tube 78 and with the solder balls melted by the hot air as shown by the squiggly arrows 74 allows removal of the component off of the board 62. The outer nozzle 86 prevents neighboring components on the board 62 from being heated. The repair station inner nozzle 90 helps form desirable hot air flow paths.

To secure a new package 10 on the board 62, the package is positioned at the desired location on the board with the solder balls 66 thereagainst. The repair station 70 is positioned over it, and the hot air 74 injected down and around and under to heat and reflow the solder balls 66, thereby mounting the package 10 to the board. The nozzles 86, 90 of the repair station 70 efficiently direct the hot air to the solder balls 66 without heating adjacent components.

Thus, the present invention provides a secure locking mechanism for attaching a threaded heat sink 50 to the top of an EPBGA package 10. The package 10 is very inexpensive. It also allows the customer end user the ability to remove and/or replace at their discretion the defective component for repair or replacement. This is accomplished by building into the package 10 an inexpensive lock ring 30, which can be easily adhered to the substrate 14 by the encapsulant 42 covering the wire bonds 26.

From the foregoing detailed description, it will be evident that there are a number of changes, adaptations and modifications of the present invention which come within the province of those skilled in the art. However, it is intended that all such variations not departing from the spirit of the invention be considered as within the scope thereof as limited solely by the claims appended hereto.

What is claim is:

1. A method of fabricating an integrated circuit package, comprising the steps of:

providing a die with top and bottom surfaces;

attaching and electrically connecting the bottom surface of the die to a substrate;

positioning a lock ring having a threaded opening on the substrate and around the die such that the area of the opening, as measured in a plane parallel to the top surface of the die, is greater than the area of the top surface of the die; and applying encapsulant through the opening to cover the die and adhere the lock ring to the substrate such that at least part of the encapsulant contacts the top surface of the die.

2. The method of claim 1 wherein the substrate is a ball grid array substrate.

3. The method of claim 1 wherein said positioning is with adhesive.

4. The method of claim 1 wherein said electrically connecting uses wire bonds.

5. The method of claim 4 wherein said applying includes the encapsulant completely covering the wire bonds and the die.

6. The method of claim 1 wherein the encapsulant is Hysol encapsulant.

7. The method of claim 1 further comprising after said applying, screwing a heat sink into an operative cooling position in the threaded opening.

8. The method of claim 1 wherein the substrate is a ball grid array substrate, and further comprising after said applying, reflowing the solder balls of the ball grid array onto a motherboard.

9. The method of claim 8 further comprising after said applying, screwing a heat sink into an operative cooling position in the threaded opening.

10. The method of claim 9 further comprising after said screwing and reflowing steps, unscrewing and removing the heat sink from the lock ring.

11. The method of claim 10 further comprising after said removing, heating the solder balls and removing the substrate and die from the motherboard.

12. The method of claim 11 wherein said heating includes positioning a repair station over the substrate.

13. The method of claim 12 wherein said heating includes directing hot nitrogen gas via the repair station to the solder balls.

14. The method of claim 1 wherein said electrically connecting includes wire bonding the die onto the substrate.

15. A process for removing a ball grid array package off of an underlying board, said process comprising the steps of:

providing a die with top and bottom surfaces;

providing an integrated circuit package having a BGA substrate, the die on the substrate, and a lock ring mounted on the substrate, the lock ring having a threaded opening around the die such that the area of the opening, as measured in a plane parallel to the top surface of the die, is greater than the area of the top surface of the die;

providing a board on which the BGA substrate is mounted;

providing a heat sink removably threaded in an operative cooling position into the threaded opening;

unscrewing the heat sink out of the threaded opening and then separating the unscrewed heat sink from the package;

after said separating, positioning a repair station over the package;

directing gas via the positioned repair station to solder balls of the BGA substrate, the gas being sufficiently hot to at least partially melt the solder balls, and thereby heating same; and after said heating, removing the package from the board.

16. The process of claim 15 wherein the heated fluid is hot nitrogen gas.

17. The process of claim 15 wherein said removing is with the repair station removed from the package.

18. The process of claim 15 wherein the package includes encapsulant covering the die and securing the lock ring to the substrate.

19. The process of claim 15 wherein the lock ring is an electric box lock nut.

20. The process of claim 15 wherein before said unscrewing, the package is in need of repair, and further comprising after said removing, repairing the package.

* * * * *